(12) United States Patent
Bonnot et al.

(10) Patent No.: US 8,481,163 B2
(45) Date of Patent: Jul. 9, 2013

(54) CARBON NANOTUBE GROWTH METHOD

(75) Inventors: Anne-Marie Bonnot, Meylan (FR); Vincent Bouchiat, Biviers (FR); Marc Faucher, Saint Egreve (FR)

(73) Assignee: Centre National de la Recherche Scientifique

( * ) Notice: Subject to any disclaimer, the term of this patent is extended or adjusted under 35 U.S.C. 154(b) by 1517 days.

(21) Appl. No.: 10/552,546

(22) PCT Filed: Apr. 14, 2004

(86) PCT No.: PCT/FR2004/050160
§ 371 (c)(1),
(2), (4) Date: Aug. 24, 2006

(87) PCT Pub. No.: WO2004/094690
PCT Pub. Date: Nov. 4, 2004

(65) Prior Publication Data
US 2007/0110971 A1     May 17, 2007

(30) Foreign Application Priority Data
Apr. 17, 2003 (FR) ...................................... 03 04830

(51) Int. Cl.
*B32B 9/00*     (2006.01)
(52) U.S. Cl.
USPC .......................... 428/408; 977/742; 423/448
(58) Field of Classification Search
CPC ........................................................ B32B 9/00
USPC ........................ 428/408; 423/447.1; 977/742
See application file for complete search history.

(56) References Cited

U.S. PATENT DOCUMENTS
2002/0004136 A1 * 1/2002 Gao et al. ..................... 428/367

FOREIGN PATENT DOCUMENTS
EP       1134304 A2     9/2001
EP       1291890 A2     3/2003

OTHER PUBLICATIONS

Marty L., et al. "Batch processing of nanometer-scale electrical circuitry based on in-situ grown single-walled carbon nanotubes", Microelectronic Engineering, Elsevier Publishers BV, Amsterdam, NL, vol. 61-62, Jul. 2002, pp. 485-489.
Jang J. W. et al, "Metallic conductivity in bamboo-shaped multiwalled carbon nanotubes", Solid State Communications, 2002, Elsevier, USA, vol. 122, No. 11, 2002, pp. 619-622.
Lee C. J., et al., "Growth and structure of carbon nanotubes produced by thermal chemical vapor deposition", Carbon, XX, XX, vol. 39, No. 12, Oct. 2001, pp. 1891-1896.
International Search Report dated Sep. 2, 200r for related French Patent Application No. FR 03/04830 of Apr. 17, 2003.

* cited by examiner

*Primary Examiner* — Maria Veronica Ewald
*Assistant Examiner* — Daniel H Miller
(74) *Attorney, Agent, or Firm* — Howard IP Law Group, PC

(57) ABSTRACT

The invention relates to a method of growing carbon nanotubes (5) on a substrate (1) using a hot-wire-assisted chemical vapor deposition method. The inventive method consists in first depositing a bilayer of titanium (12) and cobalt (13) on the substrate such that: the thickness of the titanium layer is between 0.5 and 5 nm, the thickness of the cobalt layer is between 0.25 and 10 nm, and the thickness of the cobalt layer is between half and double that of the titanium layer.

15 Claims, 1 Drawing Sheet

CARBON NANOTUBE GROWTH METHOD

CLAIM FOR PRIORITY

This application claims the benefit of French Application No. 03/04830, filed Apr. 17, 2003 and Intl. Application No. PCT/FR2004/050160, filed Apr. 14, 2004 and is incorporated herein by reference.

The present invention relates to the field of carbon nanotubes. Carbon nanotubes are tubes comprising a wall (single-wall nanotubes) or several concentric walls (multiple-wall nanotubes), each wall being formed by the winding of a graphite plane.

Various methods have been developed to grow carbon nanotubes on substrates. Most of these methods use, as a start of the carbon nanotube growth, catalyst grains of dimensions close to the diameter of the nanotubes.

Two of the inventors of the present application have provided in a paper published in Microelectronic Engineering, 2002, vol. 61-62, p. 485, Elsevier Science B.V., a method in which carbon nanotubes are obtained by a hot-filament assisted chemical vapor deposition. The deposition typically takes place in a temperature range from 700 to 900° C. while the hot filament is at a temperature on the order of from 1,900 to 2,100° C. In this paper, the authors set forth that when pads comprising a titanium layer of a 50-nm thickness coated with a thin cobalt layer are deposited on a substrate coated with silicon oxide, a carbon nanotube growth is obtained. The drawings show that this growth mainly occurs from the lateral surfaces of said pads.

In subsequent experiments, the inventors have shown that the diameter and the structure (single-wall or multiple-wall) of the nanotubes would essentially depend on the thickness of the cobalt layer.

The number of nanotubes growing from the lateral surfaces would exhibit a limited density and the obtaining of nanotubes of relatively high diameter (greater than 5 nm) implied the deposition of a cobalt layer substantially of same thickness.

An object of the present invention is to optimize the growth of carbon nanotubes by selecting an adapted substrate.

Another object of the present invention is to provide such a method adapted to the forming of carbon nanotubes on the upper surface of a thin layer.

Another object of the present invention is to optimize the growth of the carbon nanotubes on tips.

To achieve these objects, the present invention provides a method for growing carbon nanotubes on a substrate by a hot-filament assisted chemical vapor deposition method, comprising the step of previously depositing on the substrate a titanium and cobalt bilayer such that the thickness of the titanium layer ranges between 0.5 and 5 nm; the thickness of the cobalt layer ranges between 0.25 and 10 nm; and the thickness of the cobalt layer ranges between half and twice the thickness of the titanium layer.

According to an embodiment of the present invention, the titanium layer is formed on the cobalt layer.

According to an embodiment of the present invention, the substrate is made of silicon coated with oxide.

According to an embodiment of the present invention, the substrate comprises at least one tip, whereby a nanotube grows away from the substrate from the top of the tip and other nanotubes grow by spreading against the substrate.

According to an embodiment of the present invention, the method comprises the step of selecting the sum of the titanium and cobalt thicknesses according to the diameter and to the structure wanted for the nanotubes.

According to an embodiment of the present invention, the bilayer is of cobalt/titanium type and is formed on a thick titanium layer.

According to an embodiment of the present invention, the bilayer is of titanium/cobalt type and is coated with a titanium layer of a thickness greater than 20 nm, whereby the nanotubes only grow from the lateral surface of the bilayer.

The present invention also provides a substrate supporting carbon nanotubes coated with a titanium and cobalt bilayer such that the thickness of the titanium layer ranges between 0.5 and 5 nm; the thickness of the cobalt layer ranges between 0.25 and 10 nm; and the thickness of the cobalt layer ranges between half and twice the thickness of the titanium layer.

The foregoing and other objects, features, and advantages of the present invention will be discussed in detail in the following non-limiting description of specific embodiments in connection with the accompanying drawings, among which:

Figure 1:
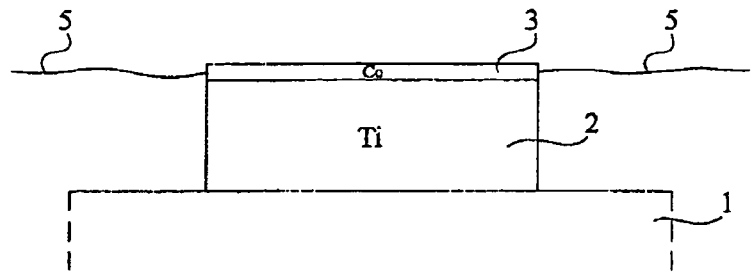
FIG. 1 shows a carbon nanotube growth structure according to prior art.

As illustrated in FIG. 1, the above-mentioned method would use as a start of a carbon nanotube growth, on a substrate coated with an $SiO_2$ layer 1, a pad formed of a titanium layer portion 2 of a thickness on the order of 50 nm coated with a thin cobalt layer 3.

The concept of pad is not limiting and must be interpreted as designating any thickness discontinuity of a layer delimited according to a selected contour.

In the previously-indicated deposition conditions, carbon nanotubes 5 growing from the lateral pad walls, substantially at the level of the cobalt layer, would be obtained as schematically shown.

The present invention provides replacing the thick titanium layer (a "thick" layer here has a thickness greater than from 10 to 20 nanometers) with a very thin layer of a thickness smaller than 5 nm.

More specifically, the titanium layer thickness ranges between 0.5 and 5 nm, the thickness of the cobalt layer ranging between 0.25 and 10 nm, and the thickness of the cobalt layer ranges between half and twice the thickness of the titanium layer.

Figure 2A:
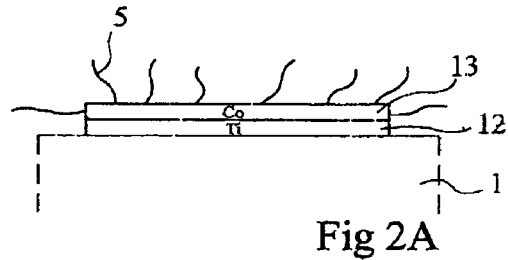
FIGS. 2A and 2B show carbon nanotube growth structures according to the present invention.
Figure 2B:
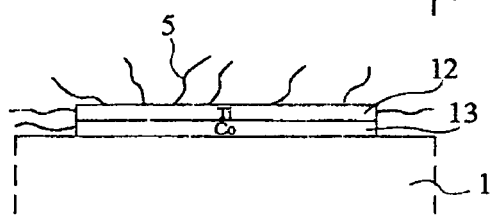

As illustrated in FIG. 2A, very thin titanium layer 12 may be arranged under cobalt layer 13 or, as illustrated in FIG. 2, titanium layer 12 may be arranged above cobalt layer 13. In both cases, a growth of carbon nanotubes 5 is obtained, in the same hot-filament assisted chemical vapor deposition conditions such as previously discussed in the case of prior art, both on the upper surface of the bilayer and on the lateral surfaces of the bilayer. It should be clear to those skilled in the art that these nanotubes are very schematically shown to indicate the locations from which they grow but that these nanotubes will be of unequal lengths and of a density that may be much greater than what is shown in the drawings.

According to an advantage of the present invention, the diameter and the structure (single-wall, multiple-wall) of these nanotubes will be substantially uniform.

According to a feature of the present invention, the inventors have experimentally found that the diameter and the structure of the nanotubes depend not only, as in prior art, on the thickness of the sole cobalt layer, but also on the thickness of both titanium and cobalt layers altogether. Further, the inventors have found that to obtain nanotubes of a given diameter, it was enough for the total thickness of the bilayer to be much smaller than the total thickness of a cobalt monolayer providing the same result. For example, for a bilayer of a given thickness, on the order of 4 nm, carbon nanotubes of a diameter substantially identical to what was obtained for a cobalt monolayer of double thickness are obtained.

It should be noted by those skilled in the art that it is advantageous to obtain nanotubes of greater diameter from a thinner deposition, given that this especially enables performing depositions on relatively distorted relieves while keeping the relief, without rounding the edges thereof.

Figure 3:
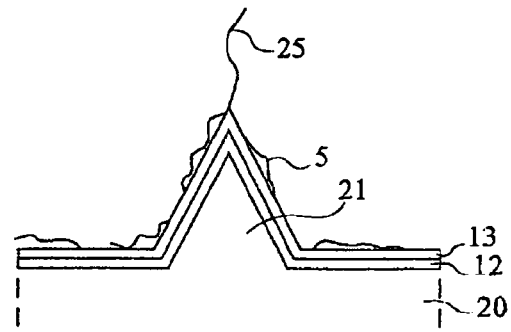
FIG. 3 shows a structure of carbon nanotube growth on a tip according to the present invention.

An advantage of this feature appears in the structure illustrated in FIG. 3 in which a silicon substrate 20 provided with a pyramidal tip 21 is coated with a titanium-cobalt bilayer 12, 13 according to the present invention. It can then be seen that, if a nanotube growth is performed, a single nanotube or a single bundle of nanotubes 25 develops from the tip away from the substrate while, from the rest of the surface, nanotubes 5 develop but remain stuck to the bilayer formed on the substrate.

According to another advantage of the present invention, the obtained carbon nanotube density is much greater than that which would be obtained from a simple deposition of a cobalt layer of same thickness as the bilayer.

Figure 4A:
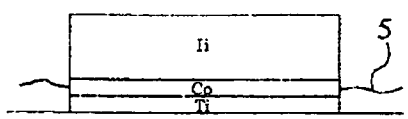
FIGS. 4A and 4B shows variations of carbon nanotube growth structures according to the present invention.
Figure 4B:
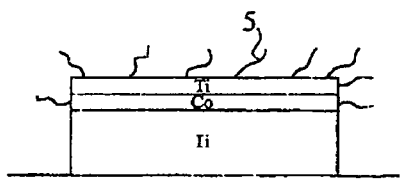

On the other hand, as illustrated in FIGS. 4A and 4B, the carbon nanotube growth areas can, according to the present invention, be selected.

For example, as illustrated in FIG. 4A, if a titanium-cobalt layer according to the present invention is coated with a thick titanium layer (of a thickness greater than from 10 to 20 nm) and the layer is structured to form a pad, a lateral growth only of nanotubes 5 will be obtained.

However, as illustrated in FIG. 4B, if a cobalt-titanium bilayer according to the present invention is deposited on a thick titanium layer, a growth of nanotubes 5 will be obtained both on the upper surface and on the lower surfaces of the bilayer.

Figure 5:
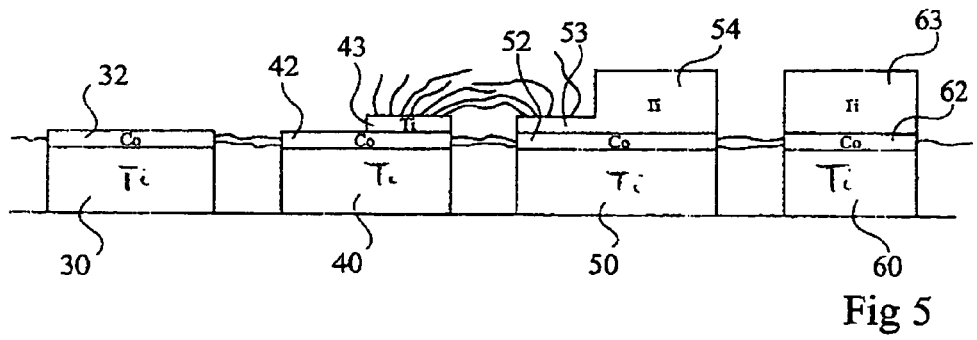
FIG. 5 shows an example of arrangement of layers used as a start for the growth of carbon nanotubes according to the present invention.

FIG. 5 shows as an example only an assembly of pads enabling optimizing the growth of carbon nanotubes, for example, to form connections between pads. Four thick titanium pads (thickness greater than from 10 to 20 nm) 30, 40, 50, 60 are formed on silicon. Pad 30 is coated with a thin cobalt layer 32. Pad 40 is coated with a thin cobalt layer 42 partially coated with a thin titanium layer 43. Pad 50 is uniformly coated with a cobalt layer 52 partially coated with a thin titanium layer 53 and partially coated with a thick titanium layer 54. Pad 60 is coated with a thin cobalt layer 62 and with a thick titanium layer 63. Then, nanotube growths are obtained as schematically illustrated in the drawing: for pad 30, nanotubes extend laterally only; for pads 40, nanotubes extend laterally, and at the surface above the portion of titanium layer 43; for pad 50, nanotubes extend laterally, and at the surface above thin titanium layer 53; and for pad 60, nanotubes extend laterally only from cobalt region 62. Starting from pads having each of their dimensions, in top view, smaller than one micrometer, the formed nanotubes aggregate in a tangle of nanotubes (a braid).

The advantages of this type of structure to form various types of connections and/or contacts, for example, electric connections, can be appreciated. It should be noted that the presence of a titanium layer provides a low resistance of access to the nanotube.

The present invention aims at an optimized method for growing carbon nanotubes and an adapted substrate. There will be a great number of applications of these nanotubes, as known in the art and as can be devised by those skilled in the art according to technological developments.

The invention claimed is:

1. A method for growing carbon nanotubes on a substrate by a hot-filament assisted chemical vapor deposition method, comprising the step of depositing on the substrate a titanium and cobalt bilayer such that:
   the thickness of the titanium layer ranges between 0.5 and 5 nm;
   the thickness of the cobalt layer ranges between 5 and 10 nm; and
   the thickness of the cobalt layer ranges between half and twice the thickness of the titanium layer.

2. The method of claim 1, wherein the titanium layer is formed on the cobalt layer.

3. The method of claim 1, wherein the substrate is made of silicon coated with oxide.

4. The method of claim 1, wherein the substrate comprises at least one tip, whereby a nanotube grows by moving away from the substrate from the top of the tip and other nanotubes grow by spreading against the substrate.

5. The method of claim 1, comprising the step of selecting the sum of the titanium and cobalt thicknesses according to the diameter and to the structure wanted for the nanotubes.

6. The method of claim 1, wherein the bilayer is of cobalt/titanium type and is formed on a titanium layer thicker than 10 nm.

7. The method of claim 1, wherein the bilayer is of titanium/cobalt type and is coated with a titanium layer of a thickness greater than 20 nm, whereby the nanotubes only grow from the lateral surface of the bilayer.

8. The method of claim 1, wherein the deposited titanium and cobalt bilayer defines two exposed lateral surfaces, and an exposed upper surface opposite the substrate, and wherein carbon nanotubes are grown on each of the two lateral surfaces and the upper surface.

9. The method of claim 8, wherein the upper surface of the bilayer is generally perpendicular to the two lateral surfaces of the bilayer such that carbon nanotubes grown on the two lateral surfaces are generally perpendicular to carbon nanotubes grown on the upper surface.

10. The method of claim 8, wherein the bilayer defines four exposed lateral surfaces.

11. A substrate supporting carbon nanotubes coated with a titanium and cobalt bilayer such that:
   the thickness of the titanium layer ranges between 0.5 and 5 nm;
   the thickness of the cobalt layer ranges between 5 and 10 nm; and
   the thickness of the cobalt layer ranges between half and twice the thickness of the titanium layer.

12. The substrate of claim 11, further comprising microtips, whereby a single carbon nanotube or a single bundle of nanotubes grows from the tip of each microtip and the growth of other nanotubes is performed by spreading on the substrate.

13. The substrate of claim 11, wherein the titanium and cobalt bilayer defines two exposed lateral surfaces, and an exposed upper surface opposite the substrate, and wherein carbon nanotubes are supported on each of the two lateral surfaces and the upper surface.

14. The substrate of claim 13, wherein the upper surface is generally perpendicular to the two lateral surfaces such that carbon nanotubes supported on the two lateral surfaces are generally perpendicular to carbon nanotubes supported on the upper surface.

15. The substrate of claim 13, wherein the bilayer defines four exposed lateral surfaces.

* * * * *